United States Patent [19]

Bauer

[11] Patent Number: 4,807,264
[45] Date of Patent: Feb. 21, 1989

[54] CIRCUIT ARRANGEMENT FOR THE ADDITION, STORAGE AND REPRODUCTION OF ELECTRIC COUNTING PULSES

[75] Inventor: Harald Bauer, Nuremberg, Fed. Rep. of Germany

[73] Assignee: Robert Bosch GmbH, Stuttgart, Fed. Rep. of Germany

[21] Appl. No.: 55,714

[22] PCT Filed: Jun. 13, 1986

[86] PCT No.: PCT/DE86/00245
§ 371 Date: May 13, 1987
§ 102(e) Date: May 13, 1987

[87] PCT Pub. No.: WO87/01884
PCT Pub. Date: Mar. 26, 1987

[30] Foreign Application Priority Data

Sep. 13, 1985 [DE] Fed. Rep. of Germany ....... 3532768

[51] Int. Cl.$^4$ .............................................. G01C 22/00
[52] U.S. Cl. ..................................... 377/24.1; 377/26; 377/28; 377/33
[58] Field of Search ..................... 377/24.1, 26, 28, 33

[56] References Cited

U.S. PATENT DOCUMENTS 4,528,683  7/1985  Henry .................................. 377/24.1

FOREIGN PATENT DOCUMENTS 0139770  11/1984  European Pat. Off. ........... 377/24.1

Primary Examiner—John S. Heyman
Attorney, Agent, or Firm—Michael J. Striker

[57] ABSTRACT

A circuit arrangement for adding, storing and reproducing electric counting pulses, is suggested, which preferably serves as an electronic kilometer counter of a motor vehicle with a distance transmitter (10). The circuit arrangement comprises an overwritable nonvolatile storage (16) which is divided into a series of storage registers (19) in which the counting pulses are stored by a one-unit shift code. When erroneous information occurs in any storage cell, the error of the indicated storage contents amounts to a maximum of ±1. This is achieved in that the control circuit (13), beginning with the first register (14), writes each new counting pulse into the next register (13, 12 . . . ) and, after reaching the last register (0), increases the contents of the first register and then the following respective registers by one unit with the next counting pulses. Such a circuit arrangement is to be used as a kilometer counter, operating time counter, quantity or piece counter, and the like.

9 Claims, 3 Drawing Sheets

FIG. 2

| $I_z$ | Reg. No. | 0 | 1 | 2 | ...... | 10 | 11 | 12 | 13 | 14 |
|---|---|---|---|---|---|---|---|---|---|---|
| 0 | | 0 | 0 | 0 | | 0 | 0 | 0 | 0 | 0 |
| 1 | | 0 | 0 | 0 | | 0 | 0 | 0 | 0 | 1 |
| 2 | | 0 | 0 | 0 | | 0 | 0 | 0 | 1 | 1 |
| 3 | | 0 | 0 | 0 | | 0 | 0 | 1 | 1 | 1 |
| 4 | | 0 | 0 | 0 | | 0 | 1 | 1 | 1 | 1 |
| 5 | | 0 | 0 | 0 | | 1 | 1 | 1 | 1 | 1 |
| ≈ | ≈ | | | | | | | | | |
| 13 | | 0 | 0 | 1 | | 1 | 1 | 1 | 1 | 1 |
| 14 | | 0 | 1 | 1 | | 1 | 1 | 1 | 1 | 1 |
| 15 | | 1 | 1 | 1 | | 1 | 1 | 1 | 1 | 1 |
| 16 | | 1 | 1 | 1 | | 1 | 1 | 1 | 1 | 2 |
| 17 | | 1 | 1 | 1 | | 1 | 1 | 1 | 2 | 2 |
| 18 | | 1 | 1 | 1 | | 1 | 1 | 2 | 2 | 2 |
| 19 | | 1 | 1 | 1 | | 1 | 2 | 2 | 2 | 2 |
| ≈ | ≈ | | | | | | | | | |
| ⇒ 43 | | 2 | 2 | 3 | | 3 | 3 | 3 | 3 | 3 |

FIG. 3

```
         16 15 . . . .        . . . 6  5  4  3  2  1
19  ─  │ 0│ 0│ 0│ 0│ 0│ 0│ 0│ 0│ 0│ 0│ 0│ 0│ 0│ 0│ 1│ 1│  e = 3 (19)
(REG. NO. 2)                         (1)
```

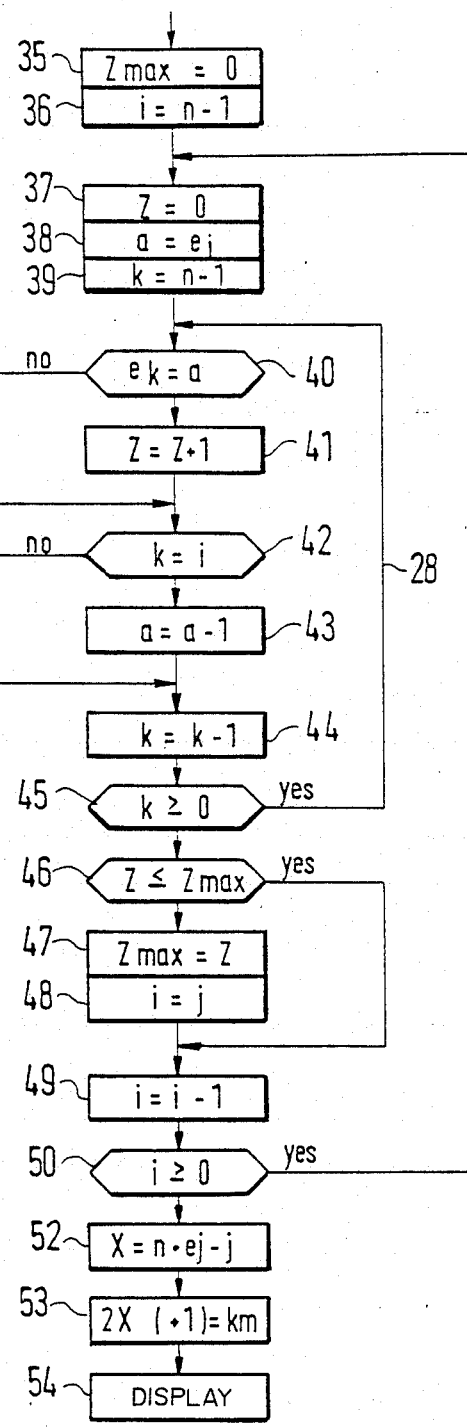

4,807,264

CIRCUIT ARRANGEMENT FOR THE ADDITION, STORAGE AND REPRODUCTION OF ELECTRIC COUNTING PULSES

PRIOR ART

The invention is based on a circuit arrangement for the addition, storage and reproduction of a quantity of electric counting pulses according to the generic part of the main claim.

In such a known circuit arangement (DE-OS No. 31 23 654), the counting pulses are read in a multiple-digit decadic counting mechanism and conveyed to a nonvolatile, decadic storage which can be overwritten. Since this storage must have a long storage time of at least 10 years, as well as a working temperature range of −25° C. to +70° C., for the use of kilometer counters in motor vehicles, floating-gate storage cells are used in the known circuit arrangements; however, these floating-gate storage cells require erasure times which increase as the quantity of erasure processes increases. Similar problems result when other so-called EEPROMs, in which the quantity of erasures should also not exceed the value of 10,000, are used as storages.

In order to limit the erasure processes in the individual storage cells, each decade of the multiple-decade counter is constructed from a 5-bit shift register in the known circuit arrangement, and the individual counting pulses are read into the ones decade in a unit-distance or cyclic code, preferably with the Libraw-Craig code. Every tenth counting pulse is read into the tens decade according to the same code, every hundredth counting pulse is read into the hundreds decade, etc. The storage connected to the multiple-decade counter is likewise constructed in multiple-decades in order to be able to store the counting pulses therein with the same unit-distance distance code. In order to distribute the number of erasure processes of the nonvolatile storage in the low decades as uniformly as possible, the assignment of the low decades of the storage to the low decades of the counter are exchanged in a cyclical manner as intervals of 100,000 kilometers, for example.

However, this solution has the disadvantage that the errors which accordingly occur in the kilometer indicator during the failure of a storage cell can be so considerable that the indicated value no longer allows inferences to be made as to the actual counter state. If such an error occurs, for example, in the higher decades of the storage in the storage cell which was written on last, or in the storage cell prior to the latter, the deviations can amount to 100, 1000, 10,000 or 100,000 kilometers.

The present solution attempts to construct a nonvolatile overwritable storage in such a way that the writing and erasing processes in the individual storage cells remain within the required time period within the framework of the allowable limits on the one hand, and, moreover, the deviation of the storage contents from the correct value does not exceed the smallest counting unit during the occurrence of an error in the storage cell.

SUMMARY AND OBJECTS OF THE INVENTION

The circuit arrangement, according to the invention, has the advantage that an electronic counter, e.g. a kilometer counter for motor vehicles with a very long service life and high accuracy, can be realized with a relatively small, overwritable, nonvalatile storage by means of the selected unit-distance code in that only one of the storage registers is modified by one unit in each instance in a rotating manner with each new counting pulse.

The erasing processes are uniformly distributed in the individual storage cells of the entire storage by means of the rotating actuating of all registers. It is another advantage that there is a high redundancy as a result of this storage process, since the failure of individual storage cells can no longer lead to the total failure of the entire counter. Rather, with the present solution, the number of erroneous storage locations results, in the most unfavorable case, in a counter state which is incorrect by the same number.

Advantageous developments and improvements of the characteristic features indicated in the main claim are made possible by means of the steps shown in the subclaims. It is particularly advisable, e.g. for a kilometer counter of a motor vehicle, to select as a storage a 16 x 16 EEPROM which is divided into 16 registers with 16 storage locations (bit) in each instance and is connected with the control circuit and a data input and output unit via lines. The counting pulses are read into the individual registers from the control circuit according to a binary code. In an advantageous manner, the control circuit and the data input and output unit are comprised in a microcomputer.

BRIEF DESCRIPTION OF THE DRAWING

FIG. 2 shows a table with the register contents as a function of the counting pulses.

FIG. 3 shows one of the storage registers and its contents.

FIG. 5 shows a flowchart for the readout and display of the storage contents.

DESCRIPTION OF THE PREFERRED EMBODIMENT

Figure 1:
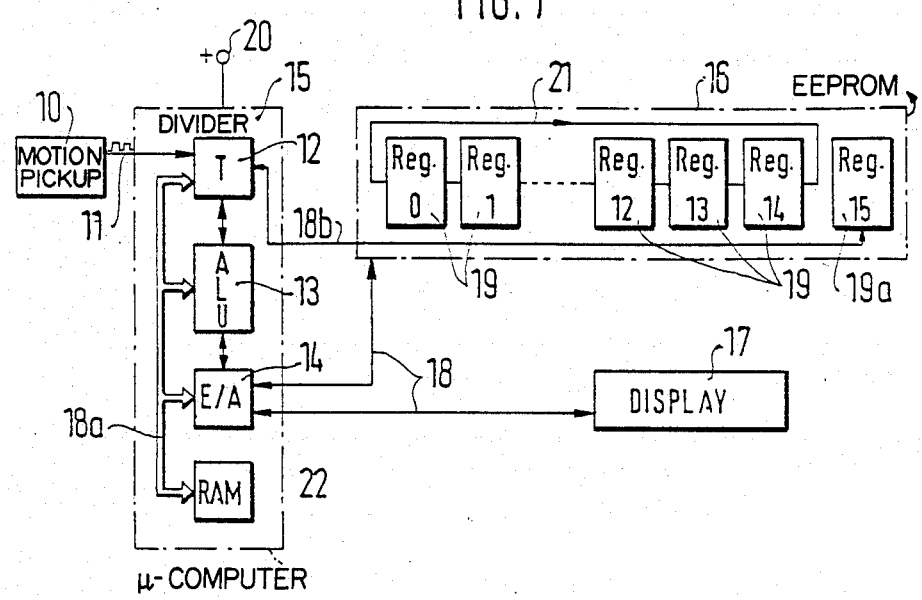
FIG. 1 shows the circuit arrangement of an electronic counter, according to the invention, in a block diagram.

The circuit arrangement, according to the invention, is provided with a motion pickup or distance transmitter 10 for a kilometer counter of a motor vehicle, according to FIG. 1, which distance transmitter 10 generates an electric pulse according to each section of a distance traveled by the vehicle. These pulses reach a preliminary divider 12 via a connection line 11 of the distance transmitter, which preliminary divider 12 is comprised in a microcomputer 15 including a control circuit (ALU) 13 and a data input and output unit (E/A) 14. The preliminary divider 12 is adjusted to the number which corresponds to the pulse number of the distance transmitter 10 when driving a distance of two kilometers in the example (or one kilometer) in dependence on the vehicle type or the wheel size of the vehicle. The circuit arrangement also comprises an overwritable, nonvolatile storage 16 in the form of a 16×16 EEPROM, as well as a display 17 in the form of a LCD indicator. The storage 16 and the display 17 are connected with the preliminary divider 12, the control circuit 13 and the data input and output 14 via control lines 18, 18a, 18b. The storage 16 is divided into a series of 16 storage registers 19, each comprising 16 one bit storage locations, wherein the positions of storage registers 19 are numbered from 0 to 15. Register No. 15 (right-hand register 19a) serves only to save via the control line 18b the counter state in the preliminary divider 12 during the failure of the supply voltage of the positive terminal 20 of the microcomputer (e.g. when the battery of the motor vehicle is disconnected). The voltage supply for saving the data is ensured by means of a buffer capacitor, which is not shown. As soon as the microcomputer is connected to its supply voltage again, the saved data is returned from the register No. 15 to the preliminary divider 12. The electric counting pulses occurring at the output of the preliminary divider 12 are transmitted to the storage 16 via the control line 18 by means of the control circuit 13 and in the storage, are counted and stored in a one unit shift the code with the aid of an indicated circular or ring control 21. Moreover, the contents of the storage 16 are read out cyclically by means of the control circuit 13 as a coded sum of the stored counting pulses and are visually indicated on the display 17. For this purpose, an intermediate storage 22, among other things, is also provided in the microcomputer 15.

The one unit shift code, according to which the individual counting pulses are read into the registers 0 to 14 of the storage 16, will now be explained in more detail with the aid of FIGS. 2 and 3. As shown in FIG. 3, each of the 16 storage registers 19 is provided with 16 storage locations or cells. In the initial state all storage locations are provided with the binary 1 information. However, in FIG. 2, for the sake of clarity, the initial state of the storage in all storage registers is assumed to have the contents 0 (inverted). Consequently, according to FIG. 2, all registers are $I_z$ first set at zero. As soon as a first counting pulse occurs at the output of the preliminary divider 12 after a driving distance of two kilometers, this counting pulse is transmitted to the storage 16 via the control line 18. All register inputs at the storage 16, with the exception of register No. 14, are first blocked so that this counting pulse is first read into register No. 14 only. Register No. 13 is then opened and register No. 14 is blocked together with the rest of the storage registers 91. After another two kilometers the next counting pulse is read into the register No. 13. The register input is then blocked and the input of register No. 12 is opened for the third counting pulse. The respective blocked storage registers 19 consequently retain their contents. With the fifteenth counting pulse the last storage register 19 (register No. 0) is also actuated and now likewise has the contents 1, like the previous storage registers. At the same time, the input of the first storage register 19 (register No. 14) is opened again and the contents of register No. 14 are increased by one unit to contain primary coded decimal 2 with the sixteenth pulse. The rest of the storage registers 19 are then increased successively by one unit in the same manner.

Such as one unit shift code ensures that the control circuit 13 writes each new counting pulse into the next storage register 19, beginning with the first storage register 19, and, after reaching the last register (register No. 0), increases the contents of the first storage register and the storage register following the latter by one unit in each instance with the next counting pulses. It can be seen from FIG. 3 that the control circuit 13 writes the counting pulses into the individual storage registers 19 according to a binary dual code. Thus, after the forty-third counting pulse (FIG. 2), the storage locations on cells 1 and 2 (FIG. 3) of the registers Nos. 2 to 14 are occupied by the logic 1 information, whereas the fourteen remaining storage cells (3 to 16) of these registers have the contents 0. According to the binary code, this corresponds to the decimal value 3, whereas the registers 0 and 1 still have the decimal binary coded value 2 (FIG. 2).

The writing in of counting pulses in the storage 16 i.e. in the respective storage registers 19 will now be explained in more detail with the aid of the flowchart shown in FIG. 4. In this flowchart, j=the printer or indicator for the register to be activated; n=the number of actuable registers=15; e=the contents of the actuated register; Reg=the actuated register.

In the initial state the register indicator j indicates the front register No. 0 and the contents e of the registers are also 0.

When a counting pulse $I_z$ occurs, the initial register indicator j is decremented by 1 in the first program step 30. Next, a check is made in step 31 as to whether the register indicator j has been decremented below the value 0. Since this is the case at the start, the register indicator j is set to the register No. 14 in step 32 (j=n−1; n=15). The value e =0 of present contents of register No. 14 is now increased by the value 1 (e−1) in step 33 and this new value e is written into the actuated register No. 14 in step 34.

Step 30 is again run through with another counting pulse, wherein the register indicator j is now set to 13. In step 31 it is determined that this value is greater than zero, so that, with a program jump 29 directly into step 34, the contents e of the register 14 which was written in last are written into the register No. 13 (Reg. j) which is now activated. This process is repeated until the register No. 0 also has the contents e=1. With the following counting pulse $I_z$, the register indicator j is now decremented below zero in step 30 and it is set to register No. 14 (j=15−1) again in step 32. In steps 33 and 34 its contents are increased by 1. The remaining storage registers 19 are now also provided with the new contents e in a stepwise manner with additional counting pulses, and, in this way, the sum of the counting pulses $I_z$ reaching the storage 16 is formed.

The indication of the kilometer counter, or the readout of the storage contents, is effected according to a flowchart shown in FIG. 5, wherein the last digit of the LCD indication, as well as the digit after the decimal point of the kilometer indication, is determined in connection with the preliminary divider 12 of the microcomputer 15 in a manner which is not shown. In order to determine the storage contents it is essential to determine the respective storage register 19 in the storage 16 in which the last counting pulse was stored. As shown in FIG. 2, this is the place at which the previous storage registers 19 (with smaller addresses) have contents which are less than all the remaining registers by a magnitude of 1. In order to found out this storage register, the contents of the first register (No. 14) are first compared with the contents of the remaining registers in a first pass of the flowchart according to FIG. 5. In another pass of the flowchart in FIG. 5, the next register (No. 13) is then compared with the rest of the registers so that the control circuit 13 progressively compares the contents of one of the storage registers 19, pointed at as index register, in each instance, with the contents of the remaining storage registers pointed at as comparison registers in a stepwise manner, beginning with the first and ending with the last storage register 19. In so doing, the contents of those comparison registers which are arranged after the index register are compared with the contents of the index register which are decremented by 1. Finally, in every program pass to every index register, the sum of the matches in the contents comparison is formed and stored temporarily. In addition, the sum of the matches which is assigned to the index register called last is compared with the sum of the matches of previous index registers and, finally, that index register with the maximum sum of matches is determined. The maximum sum of matches of 15 is reached in each instance with the index register in which the last counting pulse was written in. The sum of the counting pulses $I_z$ can now be determined by the microcomputer 15 by means of the contents of the index register which is determined in this way, and the counter state is accordingly calculated and indicated. By way of example, with the flowchart according to FIG. 5, the contents of the storage 16 are read out and displayed after the forty-third counting pulse. In so doing, registers Nos. 0 and 1 each have the contents corresponding to decimal 2, and the remaining registers Nos. 2 to 14 have the contents corresponding to decimal 3 (FIG. 2).

Figure 4:
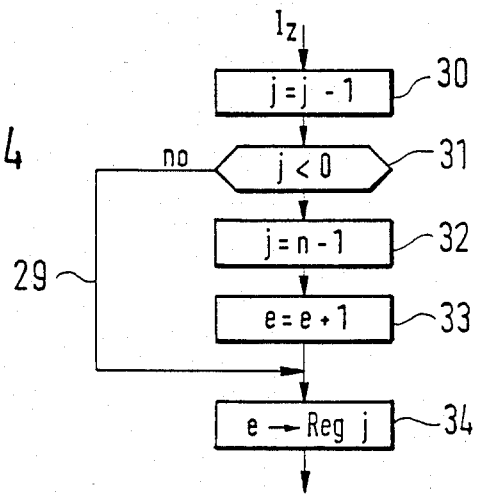
FIG. 4 shows a flowchart for the input in the storage.

The following serves to explain the flowchart of FIG. 4:
 i=pointer or indicator for index register
 $e_i$=contents of the index register
 a=comparison contents
 k=printer or indicator for comparison register
 $e_k$=contents of the comparison register
 j=pointer or indicator for register with maximum matches
 Z=match count
 $Z_{max}$=maximum match count
 X=storage contents (=calculated counter state)

In order to determine the contents of the storage 16 a maximum match count ($Z_{max}$) in the intermediate (RAM) storage 22 of the microcomputer 15 is set to zero in a first program step 35, and the indicator i for the index register which is selected for comparison is set to n−1=14 in step 36, wherein the total number of available registers is n=15. In step 37 a match count Z=0 is set and, in step 38, the contents $e_i$ of the index register are stored temporarily as comparison contents a. In the present instance, a=3 in register No. 14. In step 39 an indicator k for a comparison register is likewise set to 14, register No. 14 accordingly first forms the index register as well as the comparison register. Therefore, in step 40 it is determined that the contents $e_k$ of the comparison register agree with the comparison contents a. In step 41 the previous contents (Z=0) of the match counter is increased by 1 and a check is made in step 42 as to whether the indicator k for the comparison register agrees with the indicator i for the index register. Since this is the case in the present instance, the previous comparison contents a=3 are decremented by 1 in step 43 in order to get a maximum match sum only for the case in which all previous comparison registers (registers No. 0 to 13) have contents which are lower by 1. In step 44 the indicator k for the comparison register is decremented by 1 so that register No. 13 is now put to use as the comparison register. In step 45 a check is made as to whether the indicator k for the comparison register is not yet below zero. Since this is not yet the case, steps 40 to 44 are run through again in a loop 28.

However, since the contents $e_k$ of the register No. 13 do not agree with the new comparison contents a=2, the match count Z is not increased after step 40, in that step 41 is skipped. Moreover, since the comparison register No. 13 now no longer agrees with the index register No. 14, step 43 is also skipped and, in step 44, the indicator k for the comparison register is set to 12. In step 45 the loop 28 with steps 40 to 44 for the comparison register 12 is run through again and, again, no matches with the comparison contents are determined. This is repeated in comparison registers Nos. 11, 10 . . . to 2, after which the indicator k for the comparison register is set to 1. The loop 28, with steps 40 to 44, is now run through again by way of step 45, wherein, however, the contents $e_k$ of the comparison register agree with the comparison contents a=2. In step 41 the match counter Z is consequently increased by 1 to 2. In the last loop pass with register No. 0 as comparison register, matches are also determined and the counter Z is accordingly increased to 3. The loop is now abandoned in step 45 and the contents Z of the match counter Z are compared in step 46 with the maximum match count $Z_{max}$, which was previously set to 0, and a new maximum match count $Z_{max}=Z$ is determined. In step 47 the contents Z of the match counter are taken over in the maximum counter, and the indicator i of the index register is stored temporarily in step 48 as indicator j for the register with the maximum match sum.

In step 49 the indicator i for the index register is now decremented by 1 and a check is made in the following step 50 as to whetehr all storage registers 19 have already been called as index registers. As long as this is not yet the case, the next storage register 19 is selected as new index register by means of the index register indicator i and the program step 37 of the flow chart according to FIG. 5 is skipped back to by way of the loop 51.

Consequently, in the new pass of the loop 51, register 13, an index register, is compared with the rest of the storage registers 19 and the number of matches of these comparison register contents $e_k$ with the comparison contents a is formed in the match counter Z. Four matches now result at registers Nos. 14, 13, 1 and 0. The maximum match counter is consequently set to 4 in step 47 and, in step 48, the register No. 13 is now recognized as the register with the highest sum of matches so far and stored temporarily with the indicator j.

In another program pass by way of the loop 51, register No. 12 is then selected as the new index register and five matches are determined, that is, with registers Nos. 14, 13, 12, 1 and 0. The maximum counter $Z_{max}$ is increased again in step 47. This process if repeated with each new program pass by way of the loop 51. Finally, with register No. 2 as index register, matches between all 15 storage registers 19 and the respective comparison contents a are determined and the maximum counter is set to 15 in step 47. In step 48 register No. 2, as the register with the maximum number of matches, is stored temporarily. In step 49 register No. 1 is then selected as the new index register and only one more match is determined by way of the loop 51, that is, with itself. The match counter Z consequently no longer reaches a new maximum, so that steps 47 and 48 and skipped after step 46 and register No. 0 is selected as the new index register is a last pass of the loop 51. There is also no new match maximum with the comparison registers in this case. In step 49 the indicator i for the index register is now decremented by 1 and accordingly falls below zero. It is now determined in step 50 that all storage registers 19 have been selected as index registers and have been set in relation to the comparison registers. The indicator j, which was stored temporarily in step 48, now accordingly indicates the register with the maximum sum of matches-register No. 2 in the example.

It is the storage register No. 2 into which the last counting pulse $I_z=43$ was read in the example of FIG. 2. In step 52 the contents X of the storage 19 are determined from the quantity n ($=15$) of the storage register 19, the contents $e_j(=3)$ of the register No. 2 with the maximum number of matches $Z_{max}$ and from the position number of the register pointed at by the indicator j ($=2$) i.e. the determined register No. 2 according to the following formula:

$$X = n \times e_j - j$$

$$X = 15 \times 3 - 2 = 43$$

In step 53 the kilometer state is calculated from this value and from the contents of the preliminary divider 12. Since a counting pulse is written into the storage 16 only every two kilometers, the determined value X must consequently be multiplied by 2 and the calculated value is increased by 1 according to the counter state of the preliminary divider 12. Finally, in step 54, the kilometer state which has been determined in this way is indicated on the display 17 by the microcomputer 15.

Since the storage cells of an EEPROM, as storage 16, is guaranteed only up to 10,000 writeovers according to the current manufacturers' specifications, and since, in addition, the storage cells of the registers 19 are erased and rewritten in a rotating manner after every fifteenth counting pulse, there is a maximum number of counting pulse events $X=150,000$ in the embodiment example, and consequently a maximum kilometer state of 300,000 km. If this should seen insufficient, it is easily possible to increase the maximum counter state in that, for example, the preliminary divider 12 in the microcomputer 15 transmits a counting pulse to the storage 16 only every three kilometers, or four or five kilometers. Accordingly, in program step 53 (FIG. 5) the storage contents X, together with the contents of the preliminary divider 12, must be converted to the correct kilometer state. By means of the contents of the preliminary divider 12, it is also possible to indicate on the display 17 the first digit after the decimal point in the kilometer state. An additional storage or a corresponding counting register can also be used, in a manner which is not shown, as a trip-mileage counter whose contents are indicated on the display 17.

With the circuit arrangement, according to the invention, errors in individual storage cells lead, at most, to a minute deviation of the storage contents by $X = \pm 1$. If, for example, register No. 14 has erroneous information (1) in storage cell 5—as shown in parentheses in FIG. 3—the erroneous contents $e=19$ result in this register No. 14 in the binary code. When determining the contents by means of the flowchart according to FIG. 5, the register No. 14, as index register, only has a contents match with itself as comparison register. In the other storage registers 19, as index registers, the sum Z of matches with the comparison registers is reduced by 1 in each instance, but the register No. 2 remains that register with the most matches, so that the storage contents X are correctly determined in step 52 (FIG. 5) by means of the unchanged contents $e_j$ of this register. In this case, the erroneous information in the storage cell does not lead to an incorrect result. In a new overwriting of the register No. 14 the contents of the storage cell 5 are now corrected again and the error temporarily occurring in this storage cell only led temporarily to a counter state of the maximum counter $Z_{max}$ reduced by 1, which, however, has no influence on the calculated storage contents X.

The same also applies to the erroneous information in other storage cells of the rest of the storage registers 19, with the exception of the two registers between which the register contents e differ by one unit. In the example, the latter are registers Nos. 1 and 2 with storage contents $X=43$. If, for example, erroneous information occurs at register No. 2 in the fifth storage cell, register No. 2, as index register, would not have only one match with itself, as comparison register, in the program pass according to FIG. 5. The maximum matches of $Z=14$ would now occur in register No. 3 as index register. Accordingly, an error of $-1$ results in program step 52 for the storage contents X, since the forty-third counting pulse which was read into register No. 3, can now no longer be detected. An error indication of $+1$ would then result in the example if erroneous information occurred in register No. 1 at storage cell 1, so that the contents $e=2$ of this register is now increased to decimal value 3. According to the flowchart, according to FIG. 5, register No. 1, as index register, would now reach the highest sum of matches with the comparison registers, and one counting pulse too many would be determined by way of this register No. 1 in program step 52 for determining the storage contents X.

According to the embodiment example, the individual counting pulses are read into the storage registers 19 in a rotating manner according to a binary dual code. Instead of a binary code, another binary code can also be used. It must only be taken into consideration that the code that is used is used not only for storing the counting pulses, but also for interrogating the register contents. If a larger storage 16 is used, for example, a $64 \times 16$ bit EEPROM, the storage contents can be expanded to 640,000 counting pulses. The use of the circuit arrangement, according to the invention, is therefore not restricted to kilometer counters for motor vehicles, but is usable in general as an electronic counting circuit. Consequently, operating time counters, quantity counters, through-flow counters, or the like, whose contents are not lost for a period of at least 10 years and whose accuracy with respect to contents is restricted to a maximum deviation of one unit per erroneous information in individual cells of the storage 16, can be realized by means of such a circuit arrangement.

I claim:

1. Circuit arrangement for the addition, storage and reproduction of electric pulses generated by a signal transmitter, preferably counting pulses generated by a motion pickup, comprising a series of storage registers of a nonvolatile, overwritable storage, a control circuit including programmed writing means which, starting with the first storage register, writes each new counting pulse into the next storage register while blocking the remaining ones until the last storage register is reached, then with the next counting pulse, increases by one the contents of said first storage register, and then with each new counting pulse the contents of the subsequent storage registers, means programmed for reading out in a cyclical manner the contents of said storage, said reading out means determining by mutual comparisons of the contents of all storage registers in said series a storage register with maximum matches, and then determining the sum (X) of written-in counting pulses ($I_Z$) by means of the contents ($e_j$) and the position number (j) of the storage register with maximum matches.

2. Circuit arrangement according to claim 1 wherein said sum (X) is computed according to the formula $X = n \cdot e_j - j$, wherein n is the total number of storage registers in said series.

3. Circuit arrangement according to claim 1 wherein said control circuit is an ALU of a computer, said computer including an input and output unit for applying said counting pulses to said storage, and an intermediate RAM for temporarily storing intermediate results of said comparisons and said sum (X); and further comprising a display connected to said input and output unit to visually display said sum (X).

4. Circuit arrangement according to claim 3, further comprising a preliminary divider connected between said signal transmitter and said control circuit to divide in a unit-distance code signals from said transmitter down to said counting pulses ($I_z$).

5. Circuit arrangement according to claim 3, wherein said control circuit (13) writes said counting pulses ($I_z$) into said individual storage registers (19) in a binary code.

6. Circuit arrangement according to claim 5, wherein said storage (16) is a 16×16 EEPROM which is divided into a series of 16 storage registers (19) each including 16 one bit storage locations, and is connected with said control circuit (13) and with a data input and output unit (14) by way of control lines.

7. Circuit arrangement according to claim 6, wherein said control circuit (13) determines the storage register (19) in which the last counting pulse ($I_z$) was written in by means of comparing th contents (e) of said individual storage registers (19) with one another in the cyclical readout of said contents (X) of said storage (16).

8. Circuit arrangement according to claim 7 wherein said control circuit progressively compares the contents of each one of said storage registers, pointed at as index registers (i), with the contents of all remaining storage registers, pointed at as comparison registers (k), in a stepwise manner beginning with said first storage register and ending with said last storage register, then it compares the contents ($e_k$) of said comparison registers (k), which are arranged downstream of said index register, with comparison contents (a) of said index register (i) with are decremented by 1, and then it forms and temporarily stores the sum (Z) of matches during the comparison.

9. Circuit arrangement according to claim 8, wherein said control circuit (13) compares said match sum (Z), which is assigned to said respective index register (i) which is called, with the greatest match sum ($Z_{max}$), which is assigned to a previously called index register (j), and determines and temporarily stores said index register (j) with the maximum match sum ($Z_{max}$) and determines the sum of said counting pulses ($I_z$) read into said storage (16) by means of its contents ($e_j$).

* * * * *